United States Patent
Smith et al.

(10) Patent No.: US 6,618,579 B1
(45) Date of Patent: Sep. 9, 2003

(54) TUNABLE FILTER WITH BYPASS

(75) Inventors: Malcolm H. Smith, Macungie, PA (US); Valerie J. Risk, Lebanon, NJ (US); Mark K. Lesher, Mohrsville, PA (US)

(73) Assignee: Chase Manhattan Bank, New York, NY (US)

( * ) Notice: Subject to any disclaimer, the term of this patent is extended or adjusted under 35 U.S.C. 154(b) by 0 days.

(21) Appl. No.: 09/405,744

(22) Filed: Sep. 24, 1999

(51) Int. Cl.[7] ................................. H04B 1/40
(52) U.S. Cl. ..................... 455/307; 455/77; 327/552
(58) Field of Search ..................... 455/73, 75, 77, 455/307, 220, 221, 222, 223; 327/552, 553, 554, 558, 561; 607/5

(56) References Cited

U.S. PATENT DOCUMENTS

| | | | |
|---|---|---|---|
| 4,453,258 A | * | 6/1984 | Richardson .................. 375/98 |
| 5,027,814 A | * | 7/1991 | Carroll et al. .................. 607/5 |
| 5,063,782 A | | 11/1991 | Kellett .......................... 73/654 |
| 5,241,283 A | | 8/1993 | Sutterlin ....................... 330/51 |
| 5,450,622 A | * | 9/1995 | Vandegraaf .................. 455/307 |
| 5,523,719 A | * | 6/1996 | Longo et al. ................ 327/557 |
| 5,654,550 A | * | 8/1997 | Nomura et al. ........... 250/338.3 |
| 5,914,633 A | * | 6/1999 | Comino et al. ............. 327/553 |
| 6,253,612 B1 | * | 7/2001 | Lemkin et al. ........... 73/504.02 |

* cited by examiner

*Primary Examiner*—William Trost
*Assistant Examiner*—Philip J. Sobutka

(57) ABSTRACT

An electrical circuit which includes a filter bypass mode. The circuit includes an amplifier including an inverting terminal, a noninverting terminal and an output terminal, at least one first capacitor coupled to the inverting terminal of the amplifier through at least one first switch, and, at least one second capacitor coupled to the noninverting terminal of the amplifier through at least one second switch. The electrical circuit provides filtering when the first and second switches are in a first state, and when the first and second switches are in a second state, the electrical circuit provides substantially no filtering.

27 Claims, 7 Drawing Sheets

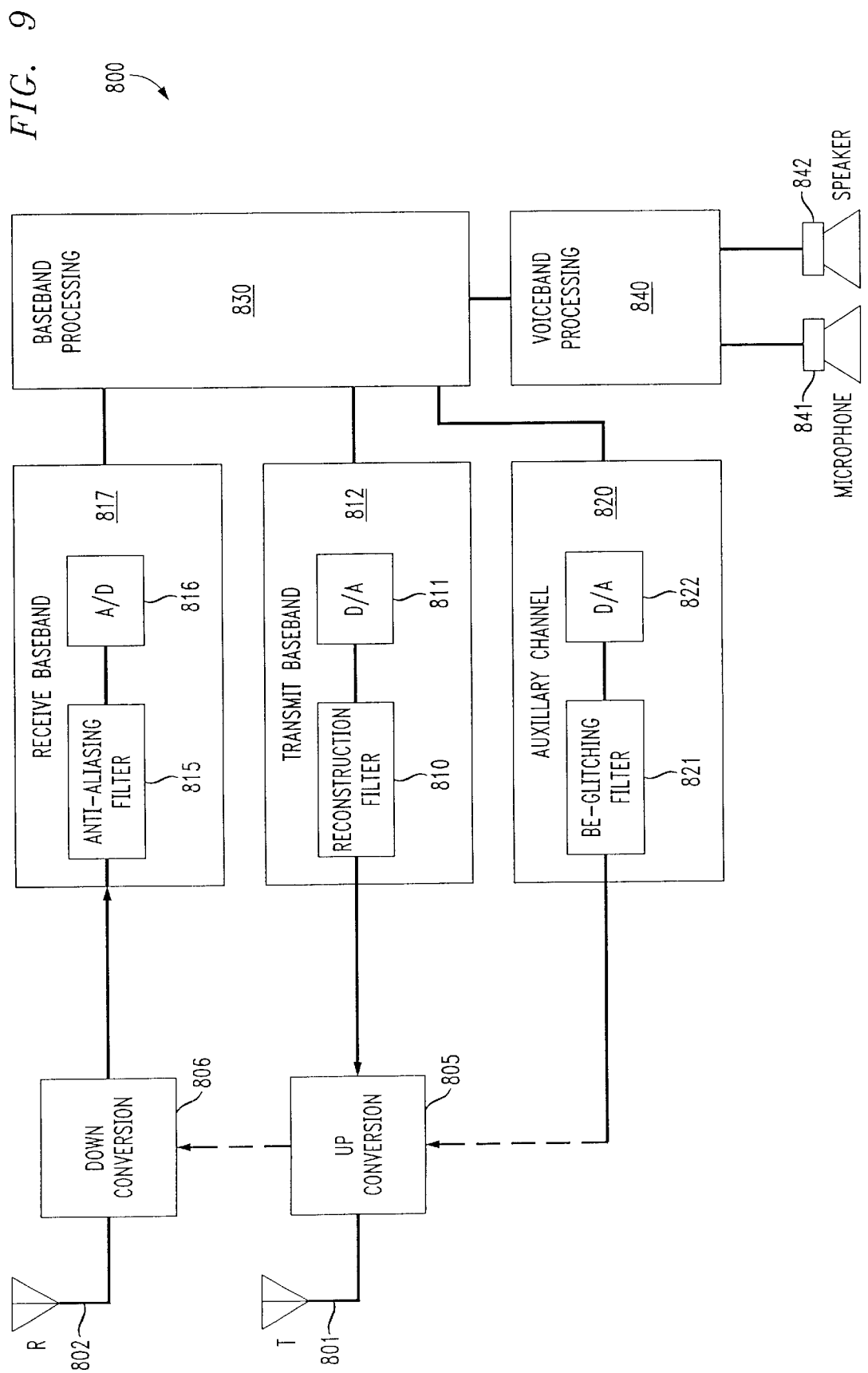

TUNABLE FILTER WITH BYPASS

FIELD OF THE INVENTION

The present invention relates to an electrical filter circuit, and in particular, an electrical filter circuit which includes a bypass mode for bypassing a filtering portion of the circuit.

DESCRIPTION OF THE RELATED ART

Filter circuits are well known in the art and are used in various applications. Filters are often used widely in telecommunications applications. For instance, wireless (e.g. cellular) communications equipment include various filters for performing the to different functions of the equipment. An example may include a reconstruction filter which follows a digital to analog (D/A) conversion device in either of the transmit or receive channels of the wireless equipment.

One well known filter circuit is the Salen and Key filter. The Salen and Key filter is an active filter which includes two basic elements: a filtering element and a amplification element. FIG. 1 shows a conventional second order low pass Salen and Key filter 10. The filter 10 includes an amplifier 20 for providing amplification, and an R-C network including two capacitors 30, 40 and two resistors 50, 55 for providing filtering. The filter 10 also includes resistors 60 and 65 which set the gain of the amplifier 20. The filter 10 includes an input terminal 12 and an output terminal 14. Signals which are presented at the input terminal 12 of the filter 10 are attenuated (and appear as such as output terminal 14) according to the passband of the low pass filter formed by capacitors 30, 40 and resistors 50, 55. Signals which are within the passband are amplified by amplifier 20 with a particular gain set by resistors 60 and 65.

Active filters such as Salen and Key filter 10 described above may be used for a variety of different reasons, including: (1) the filter function is required to multiple order, (2) large signal swing requirements, (3) linearity requirements, and (4) output drive requirements. It should be noted that the component values of the capacitors (e.g. capacitors 30, 40) of the filter 10 can be adjusted to more accurately tune the passband of the filter. This is typically accomplished by making one of the capacitors 30, 40 a variable capacitor, tuning that capacitor and a resistor (e.g. resistor 50 or 55) to a known time reference, and then tuning the other elements in accordance therewith.

Other examples of conventional active filter structures are the second order Rausch filter and the "leaky" integrator filter shown in FIGS. 2 and 3, respectively. The Rausch filter 100 includes an amplifier 120 for providing amplification, and an R-C network including two capacitors 130, 140 and three resistors 150, 155, 160 for providing filtering. The "leaky" integrator filter 200 shown in FIG. 3 includes an amplifier 220 and an R-C network including one capacitor 230 and two resistors 250, 260 for providing filtering. It will be noted that the filters shown in FIGS. 2 and 3 (e.g. Rausch and "leaky" integrator) have similar construction to the Salen and Key filter (shown in FIG. 1), but are slightly different as to the placement of the resistors and capacitors. However, all three conventional filters described above include capacitors which contribute to the filtering functions of the circuits.

Another conventional filter circuit 600 is shown in FIG. 4. FIG. 4 shows a full-differential third order Rausch filter. The filter 600 includes an amplifier 620 for amplification, and an R-C network including capacitors 630, 635, 640, and 645 and resistors 650–657 for providing filtering. The filter 600 differs from the other conventional filter circuits 10, 100, and 200 described above in that it includes balanced input 610, 611 and output 612, 613 terminals rather than unbalanced input and output terminals, and the amplifier 620 includes two output terminals, instead of just one.

In a conventional filter circuit applications, such as those described above, a mode may exist where the filtering function of the filter circuit is not desired, but the loading conditions on the output remain unchanged. Previous solutions to this problem required at least two buffer circuits, one with filtering elements and one without filtering elements, to accommodate both modes of operation. The requirement of two buffers requires additional area on either the silicon die or the circuit board on which the filter circuit is disposed.

Thus, there is currently a need for a combined filter and buffer circuit which includes a filter bypass mode.

SUMMARY OF THE INVENTION

The present invention is method and apparatus for providing an electrical circuit which includes a filter bypass mode. The method includes the steps of: providing at least one switched filtering element in a filtering circuit, and switching the filtering element out of the filter circuit in order to bypass the filter circuit.

The above and other advantages and features of the present invention will be better understood from the following detailed description of the preferred embodiments of the invention which is provided in connection with the accompanying drawings.

BRIEF DESCRIPTION OF THE DRAWINGS

FIG. 9 shows a telecommunications circuit including one or more of the filter circuits shown in FIGS. 5–8.

DETAILED DESCRIPTION

Figure 1:
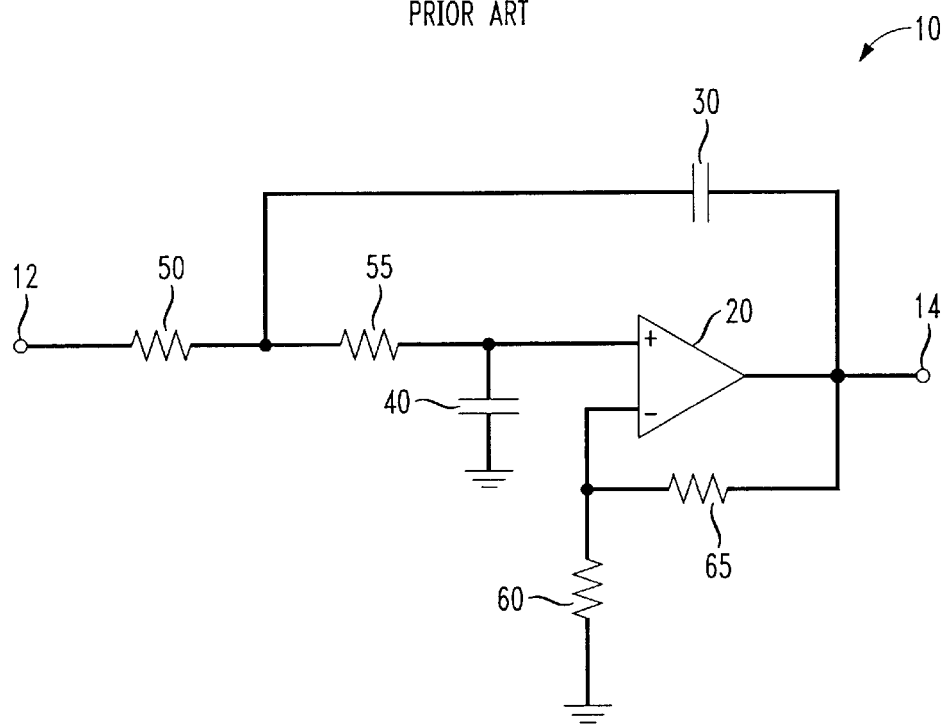
FIG. 1 shows a conventional Salen and Key filter circuit.
Figure 2:
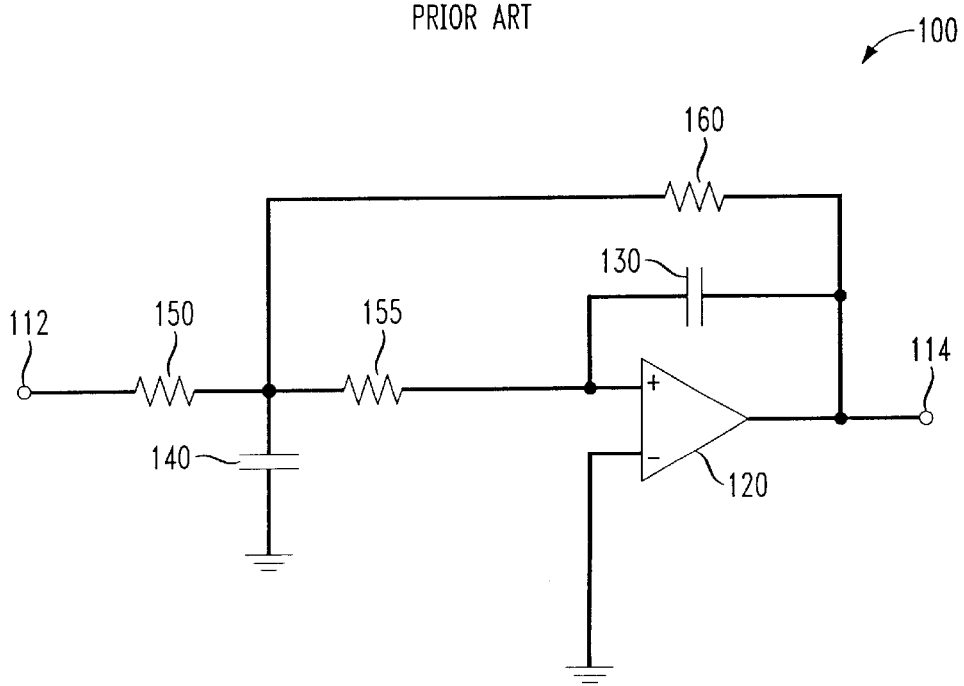
FIG. 2 shows a conventional second order Rausch filter circuit.
Figure 3:
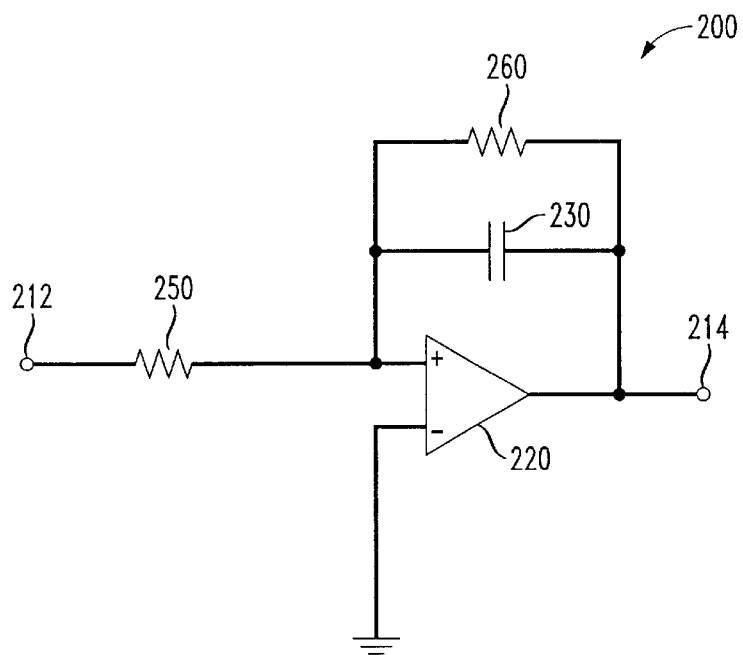
FIG. 3 shows a conventional "leaky" integrator circuit.
Figure 4:
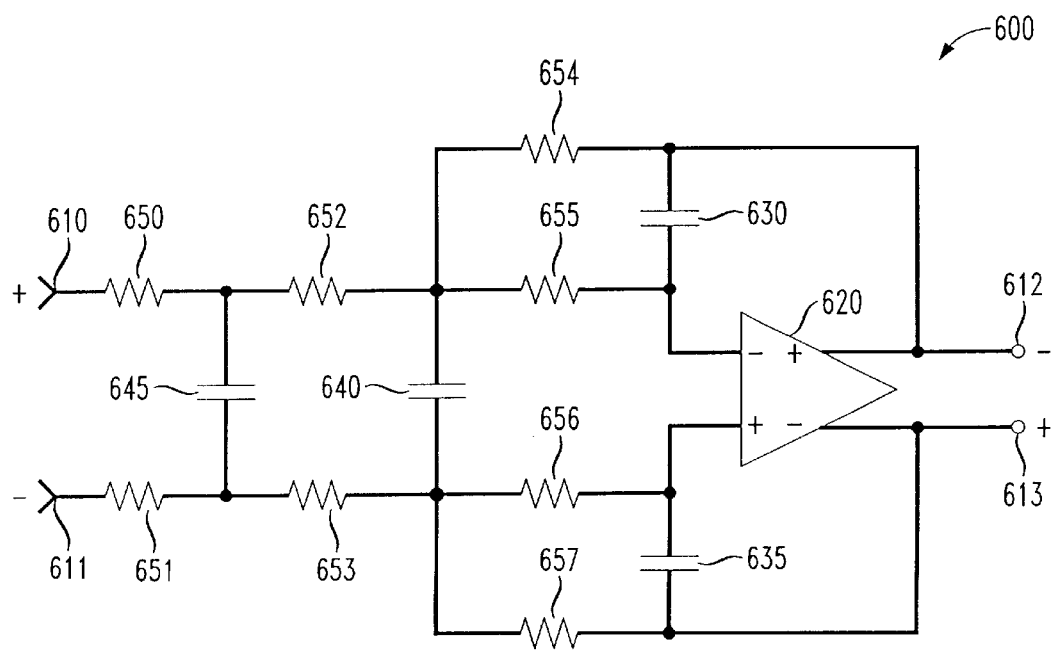
FIG. 4 shows a conventional fully differential third order Rausch filter circuit.
Figure 5:
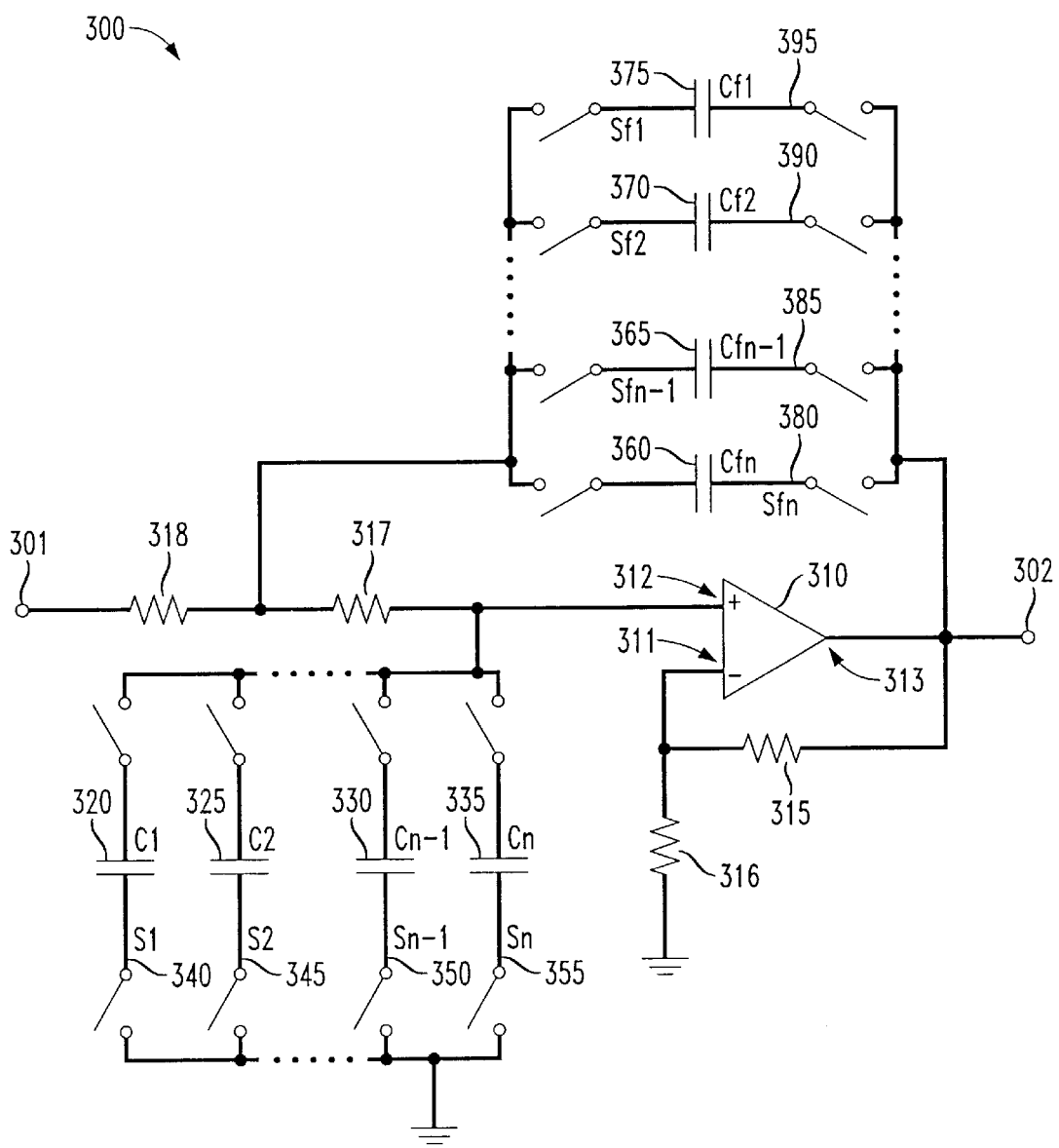
FIG. 5 shows a filter circuit according to a first exemplary embodiment of the present invention.

Referring to FIG. 5, there is shown a filter circuit 300, according to a first exemplary embodiment of the present invention. The filter circuit 300 includes an input terminal 301, an output terminal 302, and an amplifier 310 which includes an inverting terminal 311 (−), a noninverting terminal 312 (+), and an output terminal 313. The amplifier 310 is coupled, through its noninverting terminal, to a first plurality of capacitors 320–335 (also labeled C1 through Cn) through a first plurality of switches 340–355 (also labeled S1 through Sn). A second plurality of capacitors 360–375 (also labeled Cf1 through Cfn) and a second plurality of switches 380–395 (also labeled Sf1 through Sfn) are coupled between the noninverting terminal and the inverting terminal. The first plurality of capacitors 320–335 are coupled in parallel with each other between the noninverting terminal and ground. The second plurality of capacitors 360–375 are also coupled in parallel with each other between the noninverting and inverting terminals.

The first and second pluralities of switches 340–355, 380–395 allow any one (or none) of the first and second pluralities of capacitors 320–335, 360–375 to be coupled to the amplifier 310, as explained below. Also coupled between the inverting terminal and the noninverting terminal is a first resistor 315. Resistor 315 connects the inverting terminal 311 of the amplifier 310 to the second plurality of capacitors 360–375. A second resistor 316 is coupled between the inverting terminal and ground. Resistors 315 and 316 set the gain of the amplifier, as explained below. Two additional resistors 317 and 318 are coupled in series with the noninverting terminal 312 of the amplifier 310. The second plurality of capacitors 360–375 are connected to a point between the resistors 317 and 318. The switches 340–355 and 380–395 may be, for example, MOSFET (Metal-Oxide Semiconductor Field-Effect Transistor) switches controlled by a control circuit (not shown). Alternatively, the switches 340–355 and 380–395 may be any type of switch known to those skilled in the art (e.g. bipolar junction transistor (BJT) switches, Silicon Germanium (SiGe) semiconductor switches, Gallium Arsenide (GaAs) semiconductor switches, etc.).

The operation of the filter circuit 300 will next be explained. During normal filtering operation, at least one of the first and second pluralities of switches 340–355, 380–395 are closed, and thus at least one of the first and second pluralities of capacitors 320–335, 360–375 provide filtering to a signal present at the input terminal 301 of the filter circuit 300. When it is determined, by a control circuit or otherwise, that filtering is no longer required or a different degree of filtering is required, the control circuit (not shown) opens switches 340–355, 380–395 accordingly. For example, if no filtering is required, the control circuit opens all the switches 340–355, 380–395. When this occurs, the entire circuit 300 becomes nothing more than a buffer circuit, as signals pass from the input 301 to the output 302 without experiencing any filtering. Alternatively, if a different degree of filtering is required, the control circuit opens and closes only some of the switches 340–355, 380–395 so that some of the capacitors 320–335, 360–375 remain coupled to the circuit 300. As different one of the capacitors 320–335 and 360–375 are switched in and out of the circuit 300, the passband of the filter circuit is changed. Thus, the filter circuit 300 provides both a variable filter and a buffer circuit in one.

Figure 6:
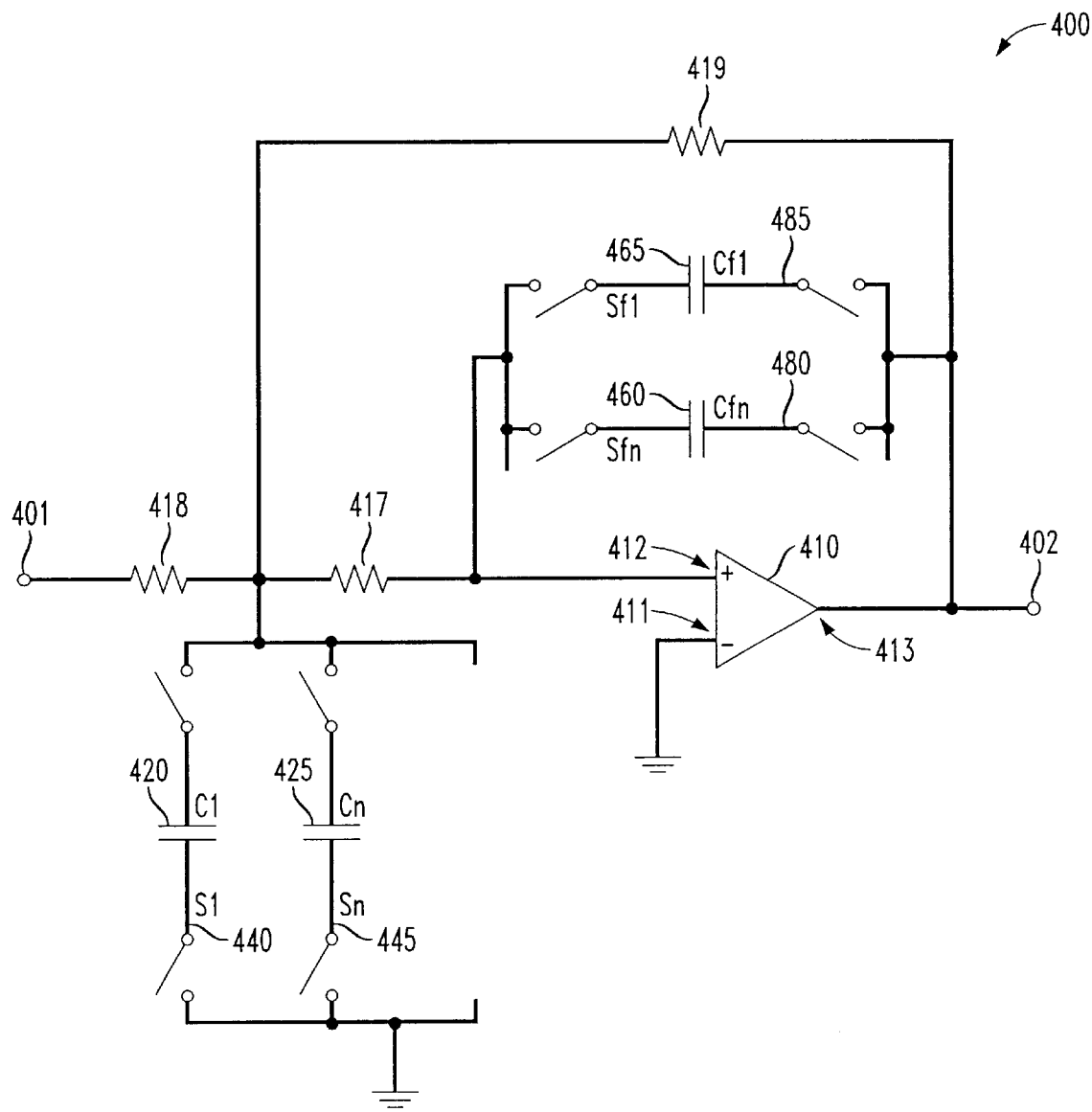
FIG. 6 shows a filter circuit according to a second exemplary embodiment of the present invention.

FIG. 6 shows a filter circuit 400, according to a second exemplary embodiment of the present invention. The filter circuit 400 is similar to the filter circuit 300, and like reference numerals denote like elements. As with the circuit 300, the circuit 400 includes a plurality of capacitors 420, 425, and 460, 465 which are switched in and out of the circuit by switches 440, 445 and 480, 485, respectively. The operation of the filter circuit 400 is similar to the operation of the filter circuit 300, therefore a detailed explanation is omitted here. Although only two sets of capacitors are coupled to the input 401 and output 402 of the circuit 400, it should be noted that any number of capacitors may be so coupled without departing from the scope of the invention.

Figure 7:
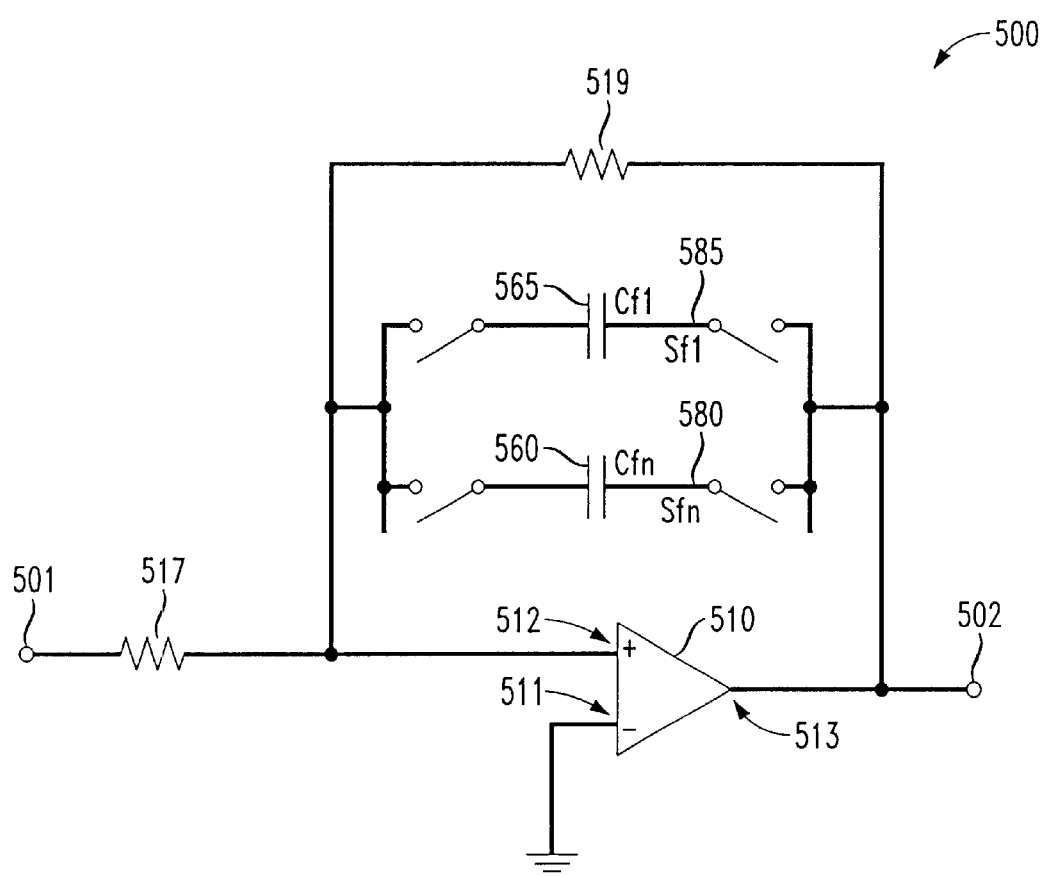
FIG. 7 shows a filter circuit according to a third exemplary embodiment of the present invention.

FIG. 7 shows a filter circuit 500, according to a second exemplary embodiment of the present invention. The filter circuit 500 is similar to the filter circuit 300, and like reference numerals denote like elements. As with the circuit 300, the circuit 500 includes a plurality of capacitors 520, 525, and 560, 565 which are switched in and out of the circuit by switches 540, 545 and 580, 585, respectively. The operation of the filter circuit 500 is similar to the operation of the filter circuit 300, therefore a detailed explanation is omitted here. Although only two capacitors are coupled to the input 501 and output 502 of the circuit 500, it should be noted that any number of capacitors may be so coupled without departing from the scope of the invention.

Figure 8:
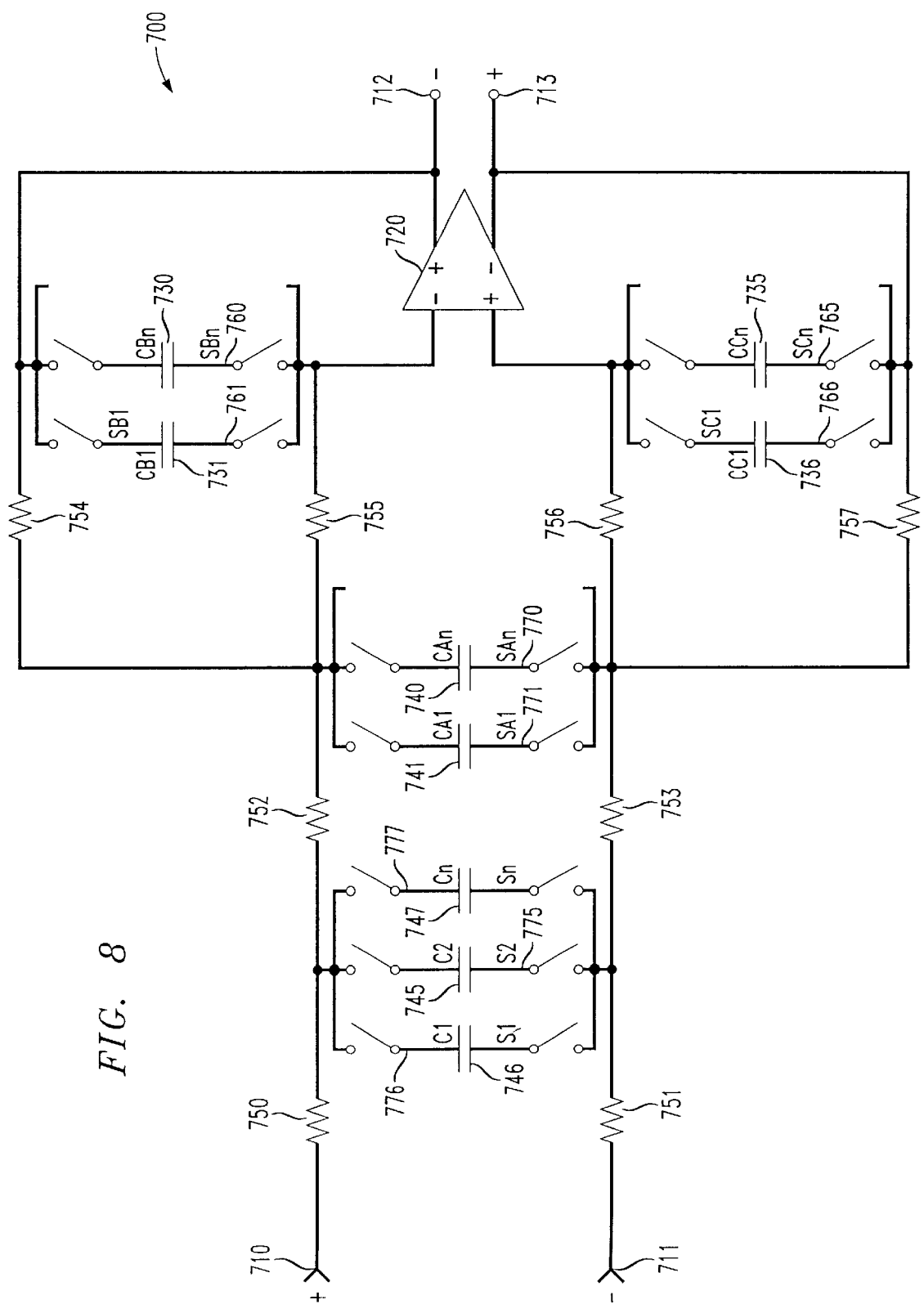
FIG. 8 shows a filter circuit according to a fourth exemplary embodiment of the present invention.

FIG. 8 shows a filter circuit 700, according to a fourth exemplary embodiment of the present invention. The circuit 700 includes input terminals 710, 711, output terminals 712, 713, and a plurality of capacitors 730, 731, 735, 736, 740, 741, 745, 746, and 747 which are switched in and out of the circuit by switches 760, 761, 765, 766, 770, 771, 775, 776, and 777, respectively. The circuit 700 also includes a plurality of resistors 751–757. The operation of the filter circuit 700 is similar to the operation of the filter circuits 300, 400 and 500, and therefore a detailed explanation is omitted here.

The filter circuits 300, 400, 500 and 700 described above may be used, for example, as baseband filters in a wireless communications apparatus.

FIG. 9 shows a telecommunications circuit 800 which may utilize any one of the filter circuits 300, 400, 500 or 700. The telecommunications circuit 800 may be, for example, a portion of the circuitry utilized in a wireless communications device, such as a cellular telephone or a cordless telephone. The circuit 800 includes a transmission antenna 801 with associated up-conversion circuitry 805, and a reception antenna 802 with associated down-conversion circuitry 806. The up-conversion circuitry 805 is coupled to a reconstruction filter 810 and a digital to analog (D/A) converter 811 of a transmission baseband unit 812. The down-conversion 806 is coupled to an anti-aliasing filter 815 and an analog to digital (A/D) converter 816 of a reception baseband unit 817. An auxiliary channel unit 820 is coupled to both the up-conversion circuitry 805 and the down-conversion circuitry 806, and includes a deglitching filter 821 and a D/A converter 822. The transmission baseband unit 812, the reception baseband unit 817 and the auxiliary channel unit 820 are all coupled to a baseband processing unit 830. The baseband processing unit 830 is, in turn, coupled to voiceband processing unit 840. The voiceband processing unit 840 is coupled to a microphone 841 for picking up signals to be transmitted, and a speaker 842 for presenting signals received by the telecommunications circuit 800. Filter circuits 300, 400, 500 or 700 may be used as, for example, the reconstruction filter 810 or the deglitching filter 821 of the above-described telecommunications circuit 800.

It should be noted that the filter circuits 300, 400, 500 and 600 shown in FIGS. 5–8 above are only exemplary. Those of ordinary skill in the art will understand that the present invention has application in any filter circuit. More particularly, the present invention has utility in filter circuits in which filtering is sometimes not required. Further, it should be noted that the above filter circuits 300, 400, 500 and 600 may be manufactured either as integrated circuits (e.g. digital signal processor, microprocessor, microcontroller) or from discrete components.

Although the above description is directed to active filter circuits, it will be understood by those skilled in the art that the techniques described above are equally applicable to passive filter circuits.

Although the invention has been described in terms of exemplary embodiments, it is not limited thereto. Rather, the appended claims should be construed broadly, to include other variants and embodiments of the invention which may be made by those skilled in the art without departing from the scope and range of equivalents of the invention.

What is claimed is:

1. An integrated circuit comprising:
   an amplifier including an inverting terminal, a noninverting terminal and an output terminal;
   at least one first capacitor coupled between the noninverting terminal of the amplifier and ground through at least one first switch; and
   at least one second capacitor coupled between the inverting terminal of the amplifier and the noninverting terminal of the amplifier through at least one second switch, wherein when the second switch is in a first state, the integrated circuit provides filtering, and when the second switch is in a second state, the integrated circuit provides no filtering,
   wherein when the first switch is in a first state, the integrated circuit provides filtering, and when the first switch is in a second state, the integrated circuit provides no filtering.

2. The integrated circuit of claim 1, wherein the at least one first switch comprises a MOSFET switch.

3. The integrated circuit of claim 1, wherein the at least one second switch comprises a MOSFET switch.

4. The integrated circuit of claim 1, wherein the at least one first switch and the at least one second switch are coupled between the amplifier and the at least one first and second capacitors respectively.

5. The integrated circuit of claim 1, wherein the circuit is formed as an integrated circuit.

6. The integrated circuit of claim 1, wherein the at least one first capacitor comprises a first plurality of capacitors and the at least one first switch comprises a first plurality of switches.

7. The integrated circuit of claim 6, wherein each of the first plurality of switches can be switched independently of one another.

8. The integrated circuit of claim 6, wherein each of the capacitors of the first plurality of capacitors are coupled in parallel with one another.

9. The integrated circuit of claim 1, wherein the at least one second capacitor comprises a second plurality of capacitors and the at least one second switch comprises a second plurality of switches.

10. The integrated circuit of claim 9, wherein each of the second plurality of switches can be switched independently of one another.

11. The integrated circuit of claim 9, wherein each of the capacitors of the second plurality of capacitors are coupled in parallel with one another.

12. An integrated circuit comprising:
    an amplifier including an inverting terminal, a noninverting terminal and an output terminal; and,
    at least one first capacitor coupled between the noninverting terminal of the amplifier and ground through at least one first switch,
    wherein when the first switch is in a first state, the integrated circuit provides filtering, and when the first switch is in a second state, the integrated circuit provides no filtering,
    wherein in the first state the circuit acts as a low pass filter.

13. An integrated circuit comprising:
    an amplifier including an inverting terminal, a noninverting terminal and an output terminal;
    at least one first capacitor coupled between the noninverting terminal of the amplifier and ground through at least one first switch; and
    a first resistor coupled between the noninverting terminal of the amplifier and an input terminal of the integrated circuit,
    wherein when the first switch is in a first state, the integrated circuit provides filtering, and when the first switch is in a second state, the integrated circuit provides no filtering.

14. An integrated circuit comprising:
    an amplifier including an inverting terminal, a noninverting terminal and an output terminal;
    at least one first capacitor coupled between the noninverting terminal of the amplifier and ground through at least one first switch;
    a first resistor coupled between the inverting terminal of the amplifier and the noninverting terminal of the amplifier; and,
    a second resistor coupled between the inverting terminal of the amplifier and ground,
    wherein when the first switch is in a first state, the integrated circuit provides filtering, and when the first switch is in a second state, the integrated circuit provides no filtering.

15. An integrated circuit comprising:
    an amplifier including an inverting terminal, a noninverting terminal and at least two output terminals;
    at least one first capacitor coupled between the noninverting terminal of the amplifier and one of the at least two output terminals of the amplifier through at least one first switch;
    at least one second capacitor coupled between the inverting terminal of the amplifier and the other of the at least two output terminals of the amplifier through at least one second switch; and,
    at least one third capacitor coupled between the inverting terminal and the noninverting terminal of the amplifier through at least one third switch,
    wherein when the first switch is in a first state, the integrated circuit provides filtering, and when the first switch is in a second state, the integrated circuit provides no filtering.

16. The integrated circuit of claim 15, further comprising:
    at least one fourth capacitor coupled between the inverting terminal and the noninverting terminal of the amplifier through at least one fourth switch.

17. A tunable filter circuit comprising:
    an amplifier including an inverting terminal, a noninverting terminal and an output terminal; and,
    at least one first capacitor coupled between the noninverting terminal of the amplifier and ground through at least one first switch,
    a first resistor coupled between the noninverting terminal of the amplifier and an input terminal of the filter,
    wherein when the first switch is in a first state, the integrated circuit provides filtering, and when the first switch is in a second state, the integrated circuit provides no filtering.

18. A tunable filter circuit comprising:
    an amplifier including an inverting terminal, a noninverting terminal and an output terminal;
    at least one first capacitor coupled between the noninverting terminal of the amplifier and ground through at least one first switch; and,
    at least one second capacitor coupled between the inverting terminal of the amplifier and the noninverting terminal of the amplifier through at least one second switch, wherein when the second switch is in a first state, the filter circuit provides filtering, and when the second switch is in a second state, the filter circuit provides no filtering, wherein when the first switch is in a first state, the integrated circuit provides filtering, and when the first switch is in a second state, the integrated circuit provides no filtering.

19. A tunable filter circuit comprising:

an amplifier including an inverting terminal, a noninverting terminal and an output terminal;

at least one first capacitor coupled between the noninverting terminal of the amplifier and the output terminal of the amplifier through at least one first switch; and, at least one third capacitor coupled between the inverting terminal and the noninverting terminal of the amplifier through at least one third switch, wherein when the first switch is in a first state, the filter circuit provides filtering, and when the first switch is in a second state, the filter circuit provides no filtering.

20. The tunable filter circuit of claim 19, further comprising:

at least one fourth capacitor coupled between the inverting terminal and the noninverting terminal of the amplifier through at least one fourth switch.

21. A method of bypassing a filter circuit comprising the steps of:

providing at least one switched filtering element in a filtering circuit; and, switching the filtering element out of the filter circuit in order to bypass the filter circuit.

22. The method of claim 21, wherein the at least one capacitor comprises a plurality of capacitors, and the at least one switch comprises a plurality of switches.

23. The method of claim 22, comprising the further step of:

selectively switching independent ones of the plurality of switches to change the filtering characteristics of the filter circuit.

24. A wireless communications device comprising:

one of the group consisting of a transmitter and a receiver; and, a tunable filter circuit, coupled to the transmitter or receiver, comprising an amplifier including an inverting terminal, a noninverting terminal and an output terminal; at least one first capacitor coupled between the noninverting terminal of the amplifier and ground through at least one first switch; and at least one second capacitor coupled between the inverting terminal of the amplifier and the noninverting terminal of the amplifier through at least one second switch, wherein when the second switch is in a first state, the integrated circuit provides filtering, and when the second switch is in a second state, the integrated circuit provides no filtering, wherein when the first switch is in a first state, the integrated circuit provides filtering, and when the first switch is in a second state, the integrated circuit provides no filtering.

25. The wireless communications device of claim 24, further comprising:

the other of the group consisting of a transmitter and a receiver.

26. A wireless communications device comprising:

one of the group consisting of a transmitter and a receiver; and, a tunable filter circuit, coupled to the transmitter or receiver, comprising an amplifier including an inverting terminal, a noninverting terminal and at least two output terminals; at least one first capacitor coupled between the noninverting terminal of the amplifier and one of the at least two output terminals of the amplifier through at least one first switch; and, at least one second capacitor coupled between the inverting terminal of the amplifier and the other of the at least two output terminals of the amplifier through at least one second switch, wherein when the first switch is in a first state, the integrated circuit provides filtering, and when the first switch is in a second state, the integrated circuit provides no filtering, further comprising, at least one third capacitor coupled between the inverting terminal and the noninverting terminal of the amplifier through at least one third switch.

27. The integrated circuit of claim 26, further comprising:

at least one fourth capacitor coupled between the inverting terminal and the noninverting terminal of the amplifier through at least one fourth switch.

* * * * *

UNITED STATES PATENT AND TRADEMARK OFFICE
CERTIFICATE OF CORRECTION

PATENT NO.    : 6,618,579 B1
DATED         : September 9, 2003
INVENTOR(S)   : Malcom H. Smith, Valerie J. Risk and Mark K. Lesher It is certified that error appears in the above-identified patent and that said Letters Patent is hereby corrected as shown below:

<u>Title page,</u>
Item [73], Assignee, delete "Chase Manhattan Bank, New York, NY" and insert therefor -- Agere Systems Inc., Allentown, PA --.

Signed and Sealed this

Fourth Day of May, 2004

JON W. DUDAS
*Acting Director of the United States Patent and Trademark Office*